(12) United States Patent
Cox

(10) Patent No.: US 11,735,232 B2
(45) Date of Patent: Aug. 22, 2023

(54) MEMORY DEVICE WITH SPLIT POWER SUPPLY CAPABILITY

(71) Applicant: MONTAGE TECHNOLOGY CO., LTD., Shanghai (CN)

(72) Inventor: Christopher Cox, San Jose, CA (US)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 125 days.

(21) Appl. No.: 17/202,326

(22) Filed: Mar. 15, 2021

(65) Prior Publication Data

US 2022/0293139 A1   Sep. 15, 2022

(51) Int. Cl.
  *G11C 5/04* (2006.01)
  *G11C 5/14* (2006.01)
  *H05K 1/18* (2006.01)

(52) U.S. Cl.
  CPC .............. *G11C 5/147* (2013.01); *G11C 5/04* (2013.01); *H05K 1/181* (2013.01); *H05K 2201/10159* (2013.01)

(58) Field of Classification Search
  CPC .......... G11C 5/147; G11C 5/04; H05K 1/181; H05K 2201/10159
  USPC ......................................................... 365/226
  See application file for complete search history.

(56) References Cited

U.S. PATENT DOCUMENTS

| 2003/0042044 | A1* | 3/2003 | Kirk | ................ | H05K 1/162 |
| | | | | | 174/250 |
| 2004/0225853 | A1* | 11/2004 | Lee | ................ | G11C 5/02 |
| | | | | | 711/173 |
| 2005/0169033 | A1* | 8/2005 | Sugita | .............. | H01L 23/552 |
| | | | | | 365/63 |
| 2015/0048521 | A1* | 2/2015 | Kwon | ............... | H01L 25/105 |
| | | | | | 257/777 |
| 2017/0104406 | A1* | 4/2017 | Kim | ................ | H01L 25/0657 |
| 2018/0059933 | A1* | 3/2018 | Helmick | .......... | G06F 3/0683 |

FOREIGN PATENT DOCUMENTS

| CN | 110083502 | A | 8/2019 |
| CN | 110175137 | A | 8/2019 |
| CN | 112148109 | A | 12/2020 |
| TW | 201923573 | A | 6/2019 |

OTHER PUBLICATIONS

The office action for the counterpart TW application dated Aug. 31, 2022.

* cited by examiner

*Primary Examiner* — Huan Hoang
*Assistant Examiner* — Minh Dinh
(74) *Attorney, Agent, or Firm* — Jun He Law Offices P.C.; James J. Zhu

(57) ABSTRACT

A memory device includes a printed circuit board having a plurality of conductive layers; memory chips mounted over the printed circuit board, wherein the memory chips comprise at least a first number of memory chips and a second number of memory chips; a first power module mounted over the printed circuit board and for providing a first set of power supplies to the first number of memory chips through the plurality of conductive layers; and a second power module mounted over the printed circuit board and for providing a second set of power supplies to the second number of memory chips through the plurality of conductive layers.

11 Claims, 1 Drawing Sheet

US 11,735,232 B2

MEMORY DEVICE WITH SPLIT POWER SUPPLY CAPABILITY

TECHNICAL FIELD

The application generally relates to memory technology, and particularly to a memory device with split power supply capability for supplying different parts of memory chips of the memory device.

BACKGROUND

A dual in-line memory module (DIMM) is a memory module that integrates multiple memory chips (e.g., dynamic random access memory (DRAM) chips) on a substrate (e.g., a printed circuit board (PCB)), which is also called as raw card. DIMMs may be classified by ranks. A rank is a block of data (e.g., 32 bits or 64 bits). A single-rank DIMM uses its memory chips to create a single block of multi-bit (e.g. 64-bit) data upon activation by a chip-select (CS) signal issued by a memory controller on the DIMM. A dual-rank DIMM includes two blocks of data from two sets of memory chips on the DIMM.

Under some scenarios a DIMM may be overclocked or overdriven to work at an operating frequency higher than its rated operating frequency, or at a supply voltage higher than its rated supply voltage, to obtain an improved performance. However, the overclocking operation may be limited in speed to some memory chips due to normal distributions of the dice the DIMM fabrication got. That is, it needs to be ascertained that every memory chip on the DIMM can work properly at such higher operating frequency, although the memory chips may have different overclocking performances. Thus, the memory chip with the worst overclocking performance on the DIMM may determine the overall overclocking capability of the DIMM.

Thus, there is a need for further improvement to the existing memory devices.

SUMMARY

An objective of the present application is to provide a memory device with split power supply capability for different parts of memory chips of the memory device.

In an aspect of the present application, there is provided a memory device. The memory device includes a printed circuit board having a plurality of conductive layers; memory chips mounted over the printed circuit board, wherein the memory chips comprise at least a first number of memory chips and a second number of memory chips; a first power module mounted over the printed circuit board and for providing a first set of power supplies to the first number of memory chips through the plurality of conductive layers; and a second power module mounted over the printed circuit board and for providing a second set of power supplies to the second number of memory chips through the plurality of conductive layers.

In an embodiment, each of the first power module and the second power module comprises a power management chip and a plurality of peripheral electrical components in electrical connection with the power management chip.

In an embodiment, the memory device further comprises: a first channel for coupling the first number of memory chips to a host device external to the memory device; and a second channel for coupling the first second of memory chips to the host device.

In an embodiment, the first channel and the second channel are both double data rate (DDR) channels.

In an embodiment, each of the first number of memory chips and the second number of memory chips comprises a rank of memory chips.

In an embodiment, each of the first number of memory chips and the second number of memory chips comprises at least two ranks of memory chips.

In an embodiment, at least one of the first set of power supplies and the second set of power supplies are configurable to provide an adjustable supply voltage or supply current.

In an embodiment, the first set of power supplies are configurable to satisfy a voltage or current requirement of the first number of memory chips.

In an embodiment, the first power module and the second power module are disposed at two opposing ends of the printed circuit board, and each being adjacent to one of the first number of memory chips and the second number of memory chips.

In an embodiment, the first power module and the second power module are both disposed at a central portion of the printed circuit board between the first number of memory chips and the second number of memory chips.

In an embodiment, the memory device further comprises a double data rate (DDR) interface via which the memory chips are coupled to a host device.

In an embodiment, the memory chips are volatile memory chips.

In an embodiment, the memory device is an unbuffered dual inline memory module (UDIMM) or a small outline dual inline memory module (SODIMM).

The foregoing is an overview of the present application, which may simplify, summarize, and omit details. Those skilled in the art will appreciate that this section is merely illustrative and not intended to limit the scope of the present application in any way. This summary section is neither intended to identify key features or essential features of the claimed subject matter nor intended to act as an auxiliary means for determining the scope of the claimed subject matter.

BRIEF DESCRIPTION OF THE DRAWINGS

The foregoing and other features of the present application will be more fully understood from the following description and the appended claims taken in conjunction with the accompanying drawings. It is to be understood that these drawings depict only a few embodiments of the contents of the present application and should not be construed as limiting the scope of the present application. The contents of the present application will be illustrated more clearly and in more detail with the accompanying drawings.

DETAILED DESCRIPTION OF THE EMBODIMENTS

Figure 1:
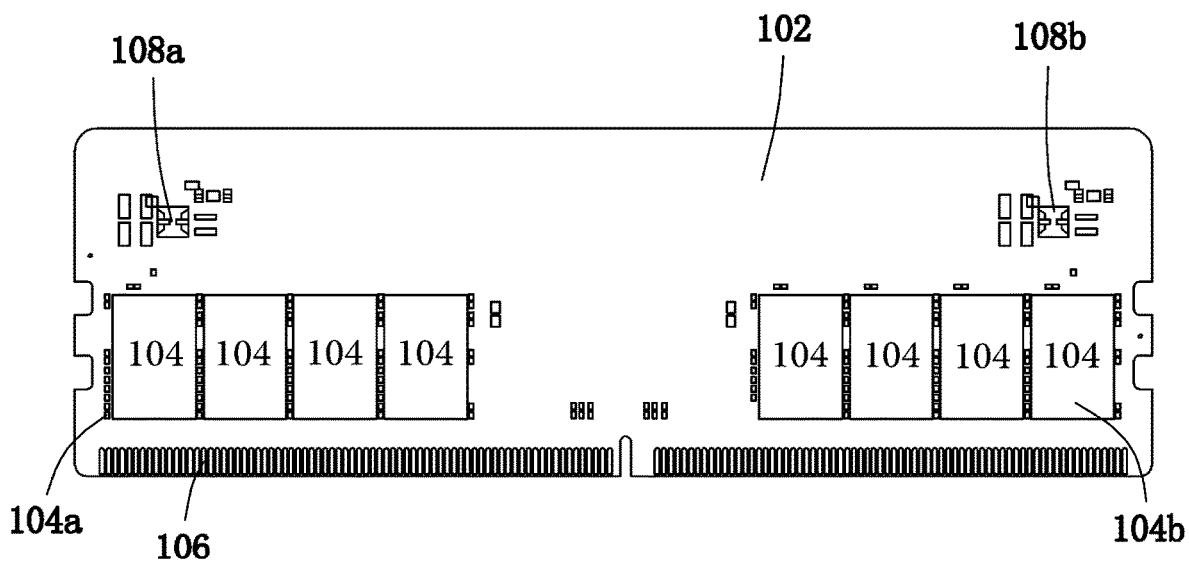
FIG. 1 shows a memory device 100 with split power supply capability according to an embodiment of the present application.

In the following detailed description, reference is made to the accompanying drawings which form a part hereof. In the drawings, similar reference numerals generally refer to similar parts unless the context clearly dictates otherwise.

The illustrative embodiments described in the detailed description, drawings and claims are not intended to be limiting. Other embodiments may be employed and other changes may be made without departing from the spirit or scope of the subject matter of the present application. It is to be understood that various configurations, substitutions, combinations and designs of the various forms of the present application, which are generally described in this application and are illustrated in the drawings, are intended to constitute a part of the present application.

FIG. 1 shows a memory device 100 with split power supply capability according to an embodiment of the present application. The memory device 100 may be coupled to a host device such as a central processing unit (CPU) via a memory interface 106 to exchange data therebetween. For example, the memory interface may be insertable into a slot or a socket of a motherboard on which the host device is mounted. In certain embodiments, the memory device 100 may be a memory device compatible with the JEDEC DDR SDRAM standard, including the JEDEC DDR2, DDR3, DDR4, DDR5 or any other DDR standards, and accordingly the interface may be a DDR interface.

As shown in FIG. 1, the memory device 100 includes a substrate which may be a printed circuit board (PCB) 102 with a plurality of conductive layers laminated thereon. The memory device 100 includes memory chips 104 mounted on one side or both sides of the PCB 102 for data storage purpose. In the embodiment shown in FIG. 1, the memory chips 104 are mounted on a single side of the PCB 102. In some examples, the memory chips may be volatile memory chips such as DRAM chips, and in some other examples, a portion or all of the memory chips may be mixed memory chips with both volatile memory chip(s) and non-volatile memory chip(s).

The memory chips may be classified into different sets based on how they are coupled to the interface 106 of the memory device 100 and how they are accessed by the host device. For a memory device in compliance with the DDR4 standard, the memory chips on the memory device may be classified into two ranks, and each rank of memory chips can support a single block of 64-bit data (without error checking and correction, ECC) or 72-bit data (with ECC) during a data access operation. The two ranks of memory chips can share the interface 106 and be activated or deactivated by a chip-select signal. For a memory device in compliance with the DDR5 standard such as the memory device 100 shown in FIG. 1, the memory chips of the memory device 100 may be classified into two or four ranks, and each rank of memory chips can support a single block of 32-bit data (without ECC) or 40-bit data (with ECC) during a data access operation. Moreover, the interface of a DDR5 memory device may include two channels with each channel being coupled to one or two ranks of memory chips. It can be appreciated by those skilled in the art that more channels or ranks of memory chips may be integrated within a single memory device compatible with any future JEDEC DDR standards or other suitable memory standards.

Still referring to FIG. 1, the memory device 100 includes a first rank 104a of memory chips and a second rank 104b of memory chips. The interface 106 of the memory device 100 includes a first channel for accessing the first rank 104a of memory chips, and a second channel for accessing the second rank 104b of memory chips. A first power module 108a and a second power module 108b are mounted over the PCB 102, to provide two sets of power supplies to the first rank 104a and the second rank 104b, respectively. In some embodiments, each of the power modules 108a and 108b may include a power management chip and a plurality of peripheral electrical components such as inductors, capacitors or other component which are not desirably integrated within the power management chip.

The power modules 108a and 108b may be coupled to the interface 106 to receive supply power and power control signals from the motherboard, and to generate the two sets of power supplies which are further provided to the respective memory chips. The power modules 108a and 108b are separated from each other, and thus, the sets of power supplies can be configured independently from each other, for example, depending on the overclocking performance of the specific ranks of memory chips receiving the set of power supplies.

In particular, the first power module 108a may be coupled to two or more power input pins of the first channel, to receive at least a bulk input (e.g. a 12 V power input supply) voltage for switching regulators integrated within the power management chip of the first power module 108a and a management input for the other components of the power management chip of the first power module 108a. Similarly, the second power module 108b may be coupled to two or more power input pins of the second channel. The power modules 108a and 108b may be coupled to other input pins of the channels to receive respective input signals, which will not be elaborated herein.

As aforementioned, the first power module 108a may be coupled to the first rank 104a of memory chips to provide a first set of power supplies to the memory chips. In some embodiments, the first set of power supplies may include low dropout (LDO) regulator outputs, switching regulator outputs, a bias output, etc. For example, the LDO regulator outputs may be used as VDD and VDDQ inputs of the first rank 104a of memory chips. Similarly, the second power module 108b may be coupled to the second rank 104b of memory chips to provide a second set of power supplies to the memory chips.

In some embodiments, one or both of the power modules 108a and 108b may be configurable, for example, through adjusting output configuration parameters (hereafter referred to as "power parameters") stored in their respective power management chips. In an example, the first power module 108a may not be configurable so that the it can only provide preset rated voltages or currents to the first rank 104a of memory chips due to a low overlocking performance of the first rank 104a of memory chips; but the second power module 108b may be configurable due to a relatively high overlocking performance of the second rank 104b of memory chips. In another example, both of the power modules 108a and 108b may be configurable, although they may or may not provide the sets of power supplies with the same power parameters. For example, the LDO output voltages of the first set of power supplies may be set as 1.8 V (for VDD) and 1.0 V (for VDDQ), while the LDO output voltages of the second set of power supplies may be set as 1.9 V (for VDD) and 1.1 V (for VDDQ) if the second rank 104b of memory chips have better overclocking performance. For another example, the maximum LDO output currents of the first set of power supplies may be set as 20 mA (for 1.8 V LDO output voltage) and 15 mA (for 1.0 V LDO output voltage), while the LDO output currents of the second set of power supplies may be set as 25 mA (for 1.8 V LDO output voltage) and 20 mA (for 1.0 V LDO output voltage) if the second rank 104b of memory chips have better overclocking performance. In other words, the voltage or current requirement of a rank of memory chips can be satisfied by changing the voltage or current output capability (e.g. adjusting the output configuration parameters) of the corresponding power module.

More details of the specification, signaling protocol and features for the power management chips of the power modules 108a and 108b may be referred to the JEDEC Power Management IC Specification standards such as JESD301-1 "PMIC50x0 Power Management IC Specification Rev. 1" published in June 2020 and JESD301-2 "PMIC5100 Power Management IC Specification" to be published, the entire contents of which are incorporated herein by reference. It can be readily appreciated that the memory device according to embodiments of the present application can be compatible with any future JEDEC power management IC standards.

Although the memory device 100 depicted in FIG. 1 includes only two ranks of memory chips, in some embodiments of the present application, the memory device may include more ranks of memory chips such as four ranks or even more. For example, two ranks of memory chips may be coupled to a first channel of the interface of the memory device, and be powered by a first power module; the other two ranks of memory chips may be coupled to a second channel of the interface of the memory device, and be powered by a second power module. It can be readily appreciated by those skilled in the art that the number of ranks of memory chips coupled to a channel is merely exemplary rather than mandatory.

In some embodiments, the memory device 100 may include a test logger (not shown) coupled to one or both of the two power modules, or two test loggers each coupled to or integrated within a power module. For example, a first test logger may be coupled to the first power module 108a and a second test logger may be coupled to the second power module 108b. An overdrive test may be performed on the first rank 104a of memory chips to determine a maximum supply voltage or supply current under which the first power module 108a can work properly. For example, during the overdrive test, the supply voltage of the first rank 104a of memory chips may be adjusted from the rated supply voltage to 150% of the rated supply voltage or even higher. The test logger may monitor the performance of the first rank 104a of memory chips under the varying supply voltage, and record the highest supply voltage before the first rank 104a of memory chips work improperly. In this way, the highest supply voltage recorded by the test logger can later be used to configure the power parameters of the power module 108a for the first rank 104a of memory chips when desired, for example, during initialization or power-on of the memory device 100. Similar overdrive test may be performed on the second rank 104b of memory chips, which will not be elaborated herein.

It can be appreciated that an elevated power supply capability can enable the corresponding rank(s) of memory chips work properly at a higher operating frequency, and accordingly, the operating frequency of the rank(s) of memory chips can be adjusted with the supply voltage/current to improve its performance as well.

Although in the above example, the power supply capability for some of the memory chips is described exemplarily as being elevated to obtain an improved data access performance, in some other examples, the power supply capability for some of the memory chips may be reduced as long as the memory chips can work properly, rendering a reduced power consumption. Reducing the power supply capability can be similarly performed due to the split power supply capability of the memory device.

In the embodiment shown in FIG. 1, the first power module 108a and the second power module 108b are disposed at two opposing ends of the printed circuit board 102, and each power module is adjacent to one of the ranks of memory chips it powers. Such layout of the power modules 108a and 108b on the PCB 102 can reduce interferences and improve wiring of the PCB. However, it can be readily appreciated that other layouts can be employed.

Figure 2:
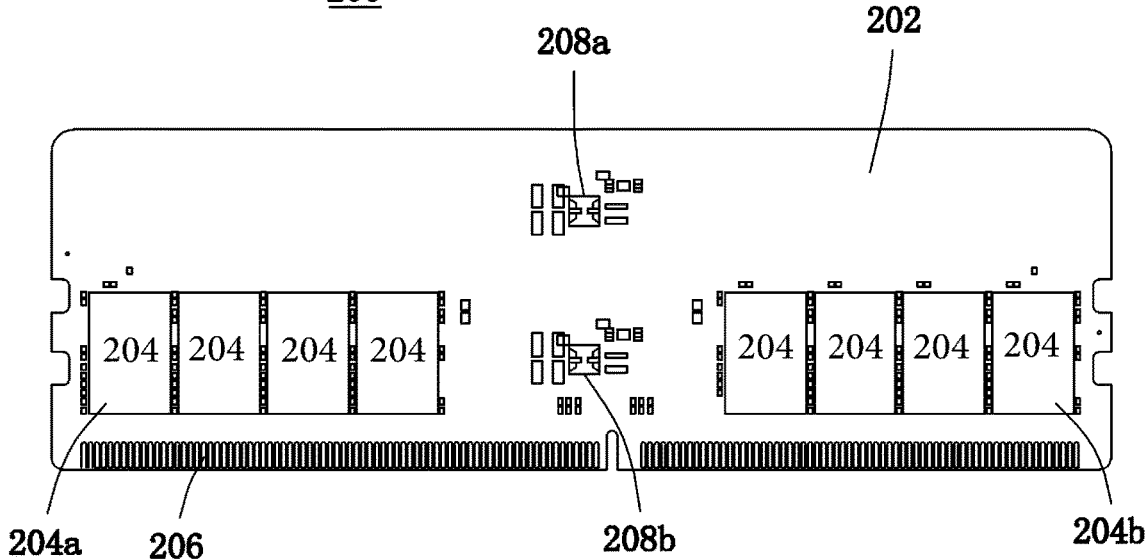
FIG. 2 shows a memory device 200 with split power supply capability according to another embodiment of the present application.

FIG. 2 shows a memory device 200 with split power supply capability according to another embodiment of the present application. As shown in FIG. 2, the memory device 200 includes two power modules 208a and 208b for two groups of memory chips 204a and 204b. The power modules 208a and 208b are disposed at a central portion of a PCB 202 of the memory device 200 between the first and second groups 204a and 204b of memory chips. In some other embodiments, one of two power modules 208a and 208b may be disposed at an end of the PCB 202 and the other of the two power modules 208a and 208b may be disposed at the central portion of the PCB 202. In another alternative embodiment, one of the two power modules 208a and 208b may be disposed on one side of the PCB 202 and the other of the two power modules 208a and 208b may be disposed on the other side of the PCB 202. Since there is generally plenty of space in the PCB 202 for the placement and wiring of the power modules 208a and 208b.

In some embodiments, the memory device may be an unbuffered dual inline memory module (UDIMM) or a small outline dual inline memory module (SODIMM). These types of DIMMs generally do not require a central memory controller such as a Registered Clock Driver (RCD) integrated on the DIMM, allowing for split power modules for different sets or groups of memory chips on the DIMM.

In addition, although the embodiments shown in FIGS. 1 and 2 both show two power modules for supplying respective groups of memory chips on a printed circuit board of a memory device, it can be readily appreciated that any other number of power modules can be integrated on a printed circuit board of a memory device, for example, three, four, six, eight or even more power modules can be provided. These different power modules can provide different sets of power supplies to respective groups of memory chips.

It should be noted that although several modules or sub-modules of memory devices with split power supply capability according to embodiments of the present application are described in the above description, this division is merely exemplary rather than mandatory. In fact, according to the embodiments of the present application, features and functions of two or more modules described above may be embodied in one module. Conversely, features and functions of one module described above can be further divided into a plurality of modules.

Those skilled in the art will be able to understand and implement other variations to the disclosed embodiments by studying the specification, the application, the drawings and the appended claims. In the claims, the words "include" or "including" do not exclude other elements and steps, and the words "a" or "an" do not exclude the plural. In the practical application of the present application, one part may perform the functions of a plurality of technical features cited in the claims. Any reference numerals in the claims should not be construed as limiting the scope.

What is claimed is:
1. A memory device, comprising:
   a printed circuit board having a plurality of conductive layers;

memory chips mounted over the printed circuit board, wherein the memory chips comprise at least a first number of memory chips and a second number of memory chips;

a first power module mounted over the printed circuit board and for providing a first set of power supplies to the first number of memory chips through the plurality of conductive layers; and a second power module mounted over the printed circuit board and for providing a second set of power supplies to the second number of memory chips through the plurality of conductive layers;

wherein at least one of the first set of power supplies and the second set of power supplies are configurable to provide an adjustable supply voltage or supply current, so as to satisfy a voltage or current requirement of the corresponding one of the first number of memory chips and the second number of memory chips.

2. The memory device of claim 1, wherein each of the first power module and the second power module comprises a power management chip and a plurality of peripheral electrical components in electrical connection with the power management chip.

3. The memory device of claim 1, wherein the memory device further comprises:

a first channel for coupling the first number of memory chips to a host device external to the memory device; and a second channel for coupling the first second of memory chips to the host device.

4. The memory device of claim 3, wherein the first channel and the second channel are both double data rate (DDR) channels.

5. The memory device of claim 1, wherein each of the first number of memory chips and the second number of memory chips comprises a rank of memory chips.

6. The memory device of claim 1, wherein each of the first number of memory chips and the second number of memory chips comprises at least two ranks of memory chips.

7. The memory device of claim 1, wherein the first power module and the second power module are disposed at two opposing ends of the printed circuit board, and each being adjacent to one of the first number of memory chips and the second number of memory chips.

8. The memory device of claim 1, wherein the first power module and the second power module are both disposed at a central portion of the printed circuit board between the first number of memory chips and the second number of memory chips.

9. The memory device of claim 1, wherein the memory device further comprises a double data rate (DDR) interface via which the memory chips are coupled to a host device.

10. The memory device of claim 1, wherein the memory chips are volatile memory chips.

11. The memory device of claim 1, wherein the memory device is an unbuffered dual inline memory module (UDIMM) or a small outline dual inline memory module (SODIMM).

* * * * *